TUNNEL DIODE BINARY OUTPUT CIRCUIT

Filed June 30, 1965 2 Sheets-Sheet 1

March 5, 1968 D. G. MEYER 3,372,289

TUNNEL DIODE BINARY OUTPUT CIRCUIT

Filed June 30, 1965 2 Sheets-Sheet 2

United States Patent Office 3,372,289

Patented Mar. 5, 1968

3,372,289

TUNNEL DIODE BINARY OUTPUT CIRCUIT

Donald G. Meyer, San Pablo, Calif., assignor to Beckman Instruments, Inc., a corporation of California Filed June 30, 1965, Ser. No. 468,219
9 Claims. (Cl. 307—286)

Figure 1A:
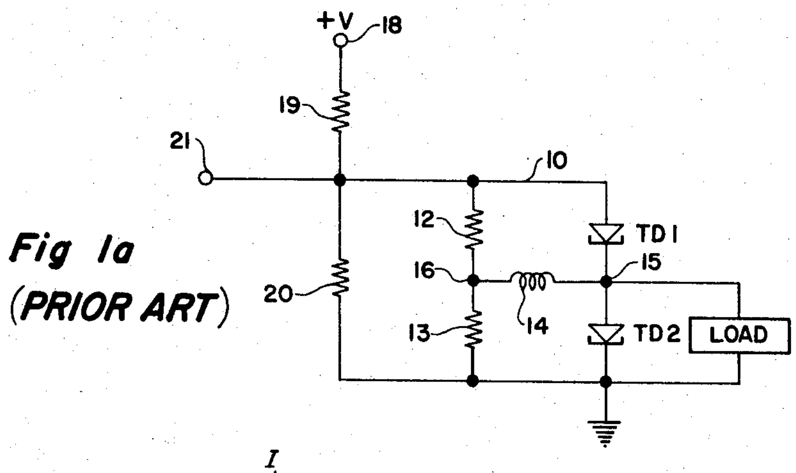
Fig 1a (PRIOR ART)

This invention relates to bistable circuits constructed of tunnel diodes, and more particularly to an output circuit and coupling therefor.

Tunnel diodes have found wide use in various electrical circuits. Among such circuits are bistable multivibrators or flip-flop circuits commonly called bistable circuits. In a well known tunnel diode bistable circuit (shown in FIG. 1 and to be discussed subsequently) one tunnel diode is in a high voltage state and the other tunnel diode is in a low voltage state. The diodes exchange states in response to an applied trigger pulse, aided by an induced voltage in a "memory" inductance.

Various problems have been encountered in coupling the output from a tunnel diode binary circuit because of unsymmetrical loading of the circuit. Various difficulties which are caused by such loading include decreased sensitivity, and degradation in the range of trigger pulse amplitude with which the circuit will operate correctly. These anomalies affect the balance of stored energy in the circuit thereby necessitating a larger memory inductor in order to retain the memory function for any given drive pulse, and thereby decrease the maximum division rate which can be achieved by the circuit.

Accordingly, it is an object of the present invention to provide an improved output coupling circuit for a tunnel diode bistable circuit which obviates the above difficulties.

It is an additional object of the present invention to derive the output from a tunnel diode bistable circuit in an improved manner.

A further object of the present invention is to provide improved coupling and output circuitry for a tunnel diode bistable circuit and which is capable of operation in excess of 600 megacycles per second.

In accordance with a specific exemplary embodiment of the teachings of the present invention, the lower shunt resistance of a tunnel diode bistable circuit is employed as the input impedance of an output circuit. A tunnel diode bistable circuit including a pair of series connected tunnel diodes, each essentially shunted by a resistance with a "memory" inductance coupled from the junction of the two diodes to the junction of the two resistances, has its output derived from across one of said resistances. This output is fed through a resistance to an amplifier stage, such as a common base transistor having its emitter voltage set close to ground level, and this voltage may be compensated so as to remain constant with temperature. In order to achieve further decoupling between the output of the bistable circuit and the amplifier, the resistance through which the output is taken may be split into parallel paths. The output of the over-all circuitry is derived from the output of the amplifier. This circuitry has been found particularly useful in a scaling circuit for prescaling high frequency input signals to a conventional digital counter.

Figure 1B:
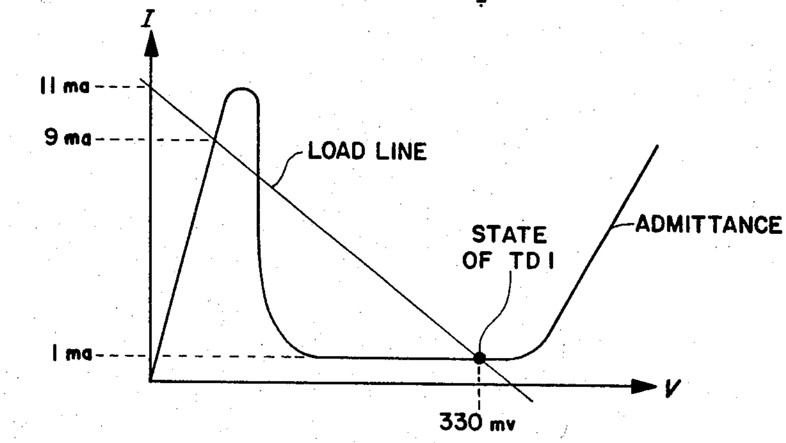
Figure 1C:
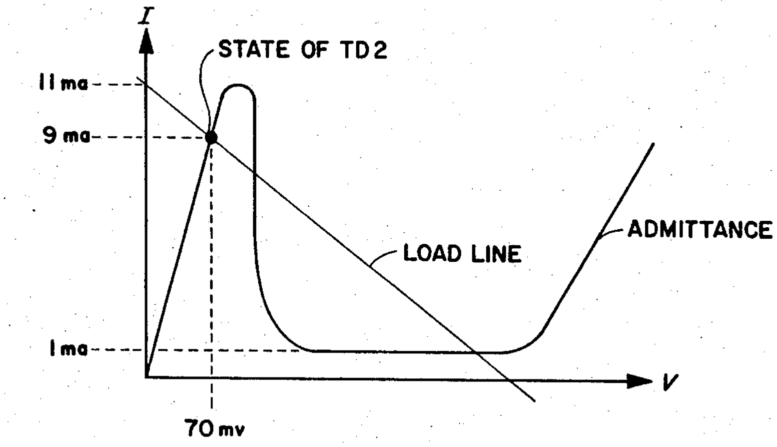
Figure 2:
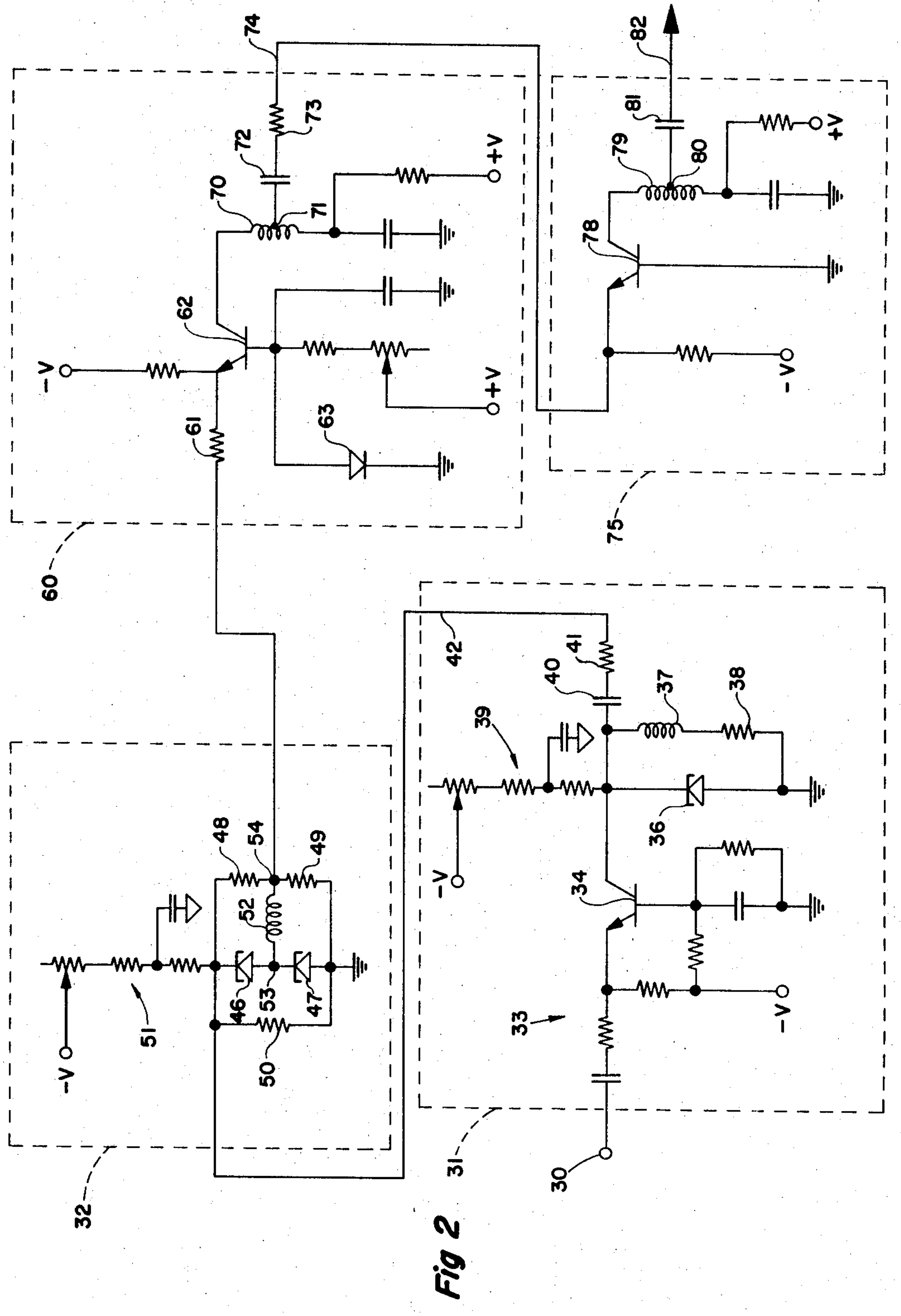

Other objects and features of the present invention will become more readily apparent through a consideration of the following detailed description taken in conjunction with the drawings, in which:

FIG. 1*a* is a circuit diagram of a typical prior art tunnel diode bistable circuit;

FIGS. 1*b* and 1*c* are curves which illustrate the operation of the circuit in FIG. 1*a*; and FIG. 2 is a circuit diagram of coupling and output circuitry for a tunnel diode bistable circuit, and input driving circuitry therefor.

A typical prior art tunnel diode bistable circuit is illustrated in FIG. 1*a*. Curves depicting the operation of the tunnel diodes are shown in FIGS. 1*b* and 1*c*. The circuit in FIG. 1*a* includes a pair of tunnel diodes TD1 and TD2 connected in series between a line or node 10 and ground 11. A pair of shunt resistances 12 and 13 also are connected in series between node 10 and ground. A "memory" inductance 14 is connected from a junction 15 of the two diodes TD1 and TD2 to a junction 16 between the resistances 12 and 13. A terminal 18, which is adapted to be connected to a positive source of bias voltage, is connected through a resistance 19 to node 10, and node 10 is connected through a resistance 20 to ground. Typically, a load is connected to the junction 15 as shown. As an example of circuit constants, the diodes may be 10 milliamp tunnel diodes, resistances 12 and 13 each 33 ohms, and resistances 19 and 20 560 and 47 ohms, respectively. An input terminal 21 is connected to node 10.

The curves in FIGS. 1*b* and 1*c* illustrate the respective admittances of diodes TD1 and TD2. The slope of the load lines are respectively equal to the reciprocal of resistances 12 and 13 (i.e., 1/R12 and 1/R13).

Assuming that an input pulse of short duration which is just sufficient to drive the bistable circuit is applied to the input terminal 21, certain conclusions can be made regarding the effects of output loading on the drive requirements and memory stability of the circuit. Assume first that the load connected to the terminal 15 is a very high impedance with respect to the other circuit components, and that the length of the drive pulse and the value of the inductance 14 are such that essentially none of the drive pulse goes through the memory inductor. Under these conditions, it can be seen (note FIG. 1*b*) that a one milliampere positive pulse through the upper diode TD1 is necessary to raise the current in the lower diode TD2 to 10 milliamperes and start regeneration. If the transient admittance component of the load now is allowed to become equal to the admittance of the tunnel diode TD2, it now is necessary to supply a two milliampere pulse through the upper diode to start regeneration since half the drive current is lost in the load. When the circuit is in the opposite state, a one milliampere pulse will drive the upper diode but the drive required is still twice as great since it must always be able to drive the lower diode. Accordingly, it will be apparent that any additional loading at terminal 15 causes decreased sensitivity of the curcuit to input drive pulses.

The bistable circuit shown in FIG. 1*a* is normally driven by a positive pulse when the diodes are arranged as shown in this figure. However, the circuit also can be driven by a negative pulse. In order for a negative pulse to trigger the circuit, the voltage across the diode which is in the low current state is lowered until this diode enters the negative resistance region of its admittance curve, and regenerates to the low voltage state. Most circuits which can be used to drive the bistable circuit can produce only a finite ratio between the amplitude of desired positive drive pulses, and spurious negative pulses. For this reason, it is desirable to have the bistable circuit as sensitive as possible in order that a drive signal may be used which does not have too large a negative spike which could cause false triggering. Sensitivity to a false (negative) trigger pulse is fairly constant despite varying sensitivity to the positive trigger pulse, therefore external loading which causes a decrease in sensitivity also causes a degradation in the range of trigger pulse amplitude with which the circuit will operate correctly.

The capacity of the bistable circuit to "remember" which state it was in before the trigger pulse was applied is principally affected by three variables; the tunnel diode capacities, memory inductance, and the applied trigger pulse. Assuming that an optimum trigger pulse is applied (i.e., one which barely causes regeneration to start and has essentially no other effects) and assume that diodes TD1 and TD2 are replaced by an equivalent circuit including respectively a capacitor representing TD1 and a short circuit representing TD2. It can be seen that the effect of the charge on the capacity of the diode TD1 is to maintain this diode in the high voltage state. After the trigger pulse has occurred, the energy stored in the inductance 14 must be sufficient such that current will continue to flow long enough to discharge the capacity of TD1 so that it can return to the low voltage state. This operation also can be viewed from the energy standpoint. If the energy in the trigger pulse is small, the bistable circuit will tend to remain in the previous state if $E_C$ (the energy stored in the stray capacity tunnel diode TD1) is greater than $E_L$ (the energy stored in the memory inductor), but will tend to change to the other state if $E_L > E_C$. Now consider the effect of the load impedance across the diode TD2 with respect to the memory mechanism. Any amplifier or output circuit which has the high D.C. impedance necessary to keep from upsetting the bias of the bistable circuit usually necessarily has a definite capacitive component of input admittance. The effect of this capacitive admittance is to provide an additional capacity which must be driven in addition to the diode capacity, which in turn upsets the balance of stored energy so that a larger inductance is required in order to retain the memory function for any given driven pulse.

The maximum repetition rate is determined by two factors for a given pair of tunnel diodes and shunt resistor values necessary for D.C. and A.C. stability; the driving pulse signal which can be realized, and the size of the memory inductance which must be used. The loading effects discussed above tend to decrease the counting rate because more stringent requirements on the drive pulse are required as the sensitivity and dynamic range of the bistable circuit are decreased. The loading effects discussed in the immediately preceding paragraph lead directly to decreased counting rate as a result of the inductance-to-resistance time constant increase when the inductance value is increased to provide more positive memory. This results because the bistable circuit takes longer to change state after trigger pulse when a larger inductance 14 is used.

Under certain circumstances, it is desirable to derive the output of the bistable circuit from point 15 because of the fast rise times appearing at this point. The output signal may then be used to drive another bistable circuit by differentiating the signal through an RC signal to obtain output pulses, or to drive some other circuit. Performance degradation as a result of this type of loading occurs as discussed above. In addition, active feedback signals from the circuitry being driven can further upset the bistable circuit. This type of arrangement is described in an article entitled, "Tunnel Diode Digital Circuitry," by W. F. Chow, which appear in the I.R.E. Transactions on Electronic Computers, pp. 295 through 301, September 1960.

Another approach which has been utilized, is to couple the output inductively from the bistable circuit by means of coupling into (by means of a tap) the memory inductor. See for example a note entitled "A One Gigacycle Binary Counter" by William C. G. Ortel, Proceedings of the IEEE, pp. 1746 and 1747, December, 1964. The problems associated with this approach are somewhat analogous to those discussed above, the basic problem still being the fact that the symmetry and memory mechanism of the bistable circuit is disrupted by the loading circuit. It is also characterized by the disadvantage of being coupled to the circuit being driven so that feedback from the driven circuit can upset the bistable circuit.

Turning now to FIG. 2, repetitive input signals (typically a sine wave) are applied to an input terminal 30 and through a driver, shaper and differentiating stage to a tunnel diode bistable circuit 32. The driver indicated generally by reference numeral 33 and including an NPN transistor 34 arranged in a common base configuration functions as a current source drive and decoupler and provides an appropriate input impedance. The shaper portion of the circuit 31 is a bistable tunnel diode shaper including a tunnel diode 36 shunted by a peaking coil 37 and resistance 38. A current source bias 39 is provided for the shaper. The differentiating network portion of the circuit 31 includes a series connected output capacitor and resistance 40 and 41 respectively. The resistance 41 is connected through a line 42 to the input of the tunnel diode bistable circuit 32.

If desired, the driver, shaper and differentiating stage may take the form of the input transistor and bistable shaper stage and differentiating stage illustrated and described in copending U.S. patent application Ser. No. 468,364 entitled, Pulse Circuitry, filed concurrently herewith by applicant, and assigned to the assignee of the present application.

The tunnel diode bistable circuit shown in FIG. 2 is similar to that shown in FIG. 1*a*, and includes a pair of series connected tunnel diodes 46 and 47 shunted by respective resistances 48 and 49, and a resistance 50. A biasing network 51 is connected to the upper electrode of the tunnel diode 46. An inductance 52 is connected between terminals 53 and 54 which are respectively connected at the junctions of the diodes 46 and 47 and the resistances 48 and 49.

According to the present invention, the terminal 54 is connected to an output amplifier circuit 60. The terminal 54 is connected through a resistance 61 to the emitter of an NPN transistor 62 arranged in a common base configuration. The circuitry including the tunnel diode bistable circuit 32 coupled to the output amplifier 60 operates on the principle of using the lower shunt resistance in the tunnel diode circuit, which resistance is a necessary element of the symmetrical tunnel diode circuit, as the input impedance of the output amplifier stage 60. The emitter voltage of the transistor 62 is set close to ground level. This is provided by varying the voltage across the diode 63 connected from the base of the transistor 62 to ground to buck out the emitted-base voltage of the transistor 62. Compensation of the emitter-base voltage change of the transistor 62 with temperature also is provided by the diode 63 whereby the emitter of this transistor remains at a substantially constant voltage despite temperature variations.

In the typical tunnel diode bistable circuit the resistances 48 and 49 are equal. In the arrangement shown in FIG. 2, the lower resistance (that across the diode 47) is split into two parallel paths in order to further decouple the output of the bistable circuit from the amplifier. Accordingly, the parallel combination of the resistance 49 with the series resistance 61 plus the emitter input resistance of the transistor 62 is selected to substantially equal the value of the resistance 48. For example, typically the resistance 48 is 33 ohms, the resistance 61 is 56 ohms, the emitter input resistance of the transistor 62 is approximately 10 ohms, and the resistance 49 is 68 ohms. Thus, resistances of 56 ohms plus 10 ohms in parallel with 68 ohms provides a resultant resistance from point 54 to ground of approximately 33 ohms. The input impedance of the emitter of the transistor 62 remains low even to very high frequencies such that operation to high frequencies is practical. The divider (resistances 49, 61, and emitter input resistance of transistor 62) may be changed to provide better decoupling or more output as desired.

The output from the amplifier 60 may be taken directly from the collector of the transistor 62 if desired. However, it has been found advantageous to provide a 2:1 transformer in the output to provide current gain and to drive a low impedance load. Accordingly, a two-to-one bi-filar current transformer 70 is connected between the collector of the transistor 62 through a resistance to a positive voltage supply and through a bypass capacitor to ground. A tap 71 is provided by connecting the ends of the two opposite bi-filar transformer windings together. The tap 71 is connected through a coupling capacitance 72, resistance 73 and a line 74 to another amplifier stage 75. The amplifier 75 is similar to the amplifier 60 without the temperature compensation provided by the diode 63. The amplifier 75 includes an NPN transistor 78 connected in a common base configuration, the collector of which is connected to a bi-filar current transformer 79 similar to the current transformer 70. A tap 80 on the transformer 79 is connected through a capacitor 81 to an output terminal 82.

It will be understood that although an exemplary embodiment of the present invention has been disclosed and discussed, other applications and arrangements are possible and that the embodiment disclosed may be subjected to various changes, modifications and substitutions without necessarily departing from the spirit of the invention.

What is claimed is:

1. An output circuit for use with a tunnel diode binary circuit, the tunnel diode binary circuit including a pair of series connected tunnel diodes connected to a bias source, first and second series connected resistances shunting said tunnel diodes, and a memory inductance connected from the junction of the tunnel diodes to the junction of said resistances, the improvement comprising an output terminal for said binary circuit connected to the junction of said resistances, an amplifier, said output terminal being connected through a third resistance to the input of said amplifier, a current transformer, and the output of said amplifier being connected through said transformer to an output terminal.

2. An output circuit as in claim 1 wherein said amplifier includes a transistor connected in a common configuration and having its emitter voltage maintained close to a reference voltage level, and a diode connected between the base of said transistor and said reference voltage level.

3. An output circuit as in claim 1 wherein the first resistance combined in parallel with the series combination of said third resistance and the input resistance of said amplifier being substantially equal to the resistance of said second resistance.

4. An output circuit as in claim 3 wherein said amplifier includes a transistor connected in a common base configuration, and the resistance of said first resistance taken in parallel with the series combination of said third resistance and the input resistance of said transistor being substantially equal to said second resistance.

5. Bistable circuitry including an input circuit; a tunnel diode binary circuit having a pair of series connected tunnel diodes connected to a bias source, first and second series connected impedances shunting said tunnel diodes, and a memory impedance connected from the junction of the tunnel diodes to the junction of said first and second impedances; and an output circuit, the improvement comprising an output terminal for said binary circuit connected to the junction between said first and second impedances, a transistor amplifier having a low input impedance, said output terminal being connected through a third impedance to the input of said amplifier, the first impedance combined in parallel with the series combination of said third impedance and the input impedance of said amplifier being substantially equal to the impedance of said impedance, and the output of said amplifier being connected to said output circuit.

6. Bistable circuitry as in claim 5 wherein said transistor amplifier is connected in a common base configuration, and a diode connected between the base of said transistor and a reference voltage.

7. Bistable circuitry as in claim 6 wherein said first, second and third impedances are resistances, and said memory impedance is an inductance.

8. An output circuit for use with a tunnel diode binary circuit, the tunnel diode binary circuit including a pair of series connected tunnel diodes connected to a bias source, first and second series connected resistances shunting said tunnel diodes, and a memory inductance connected from the junction of the tunnel diodes to the junction of said resistances, the improvement comprising an output terminal for said binary circuit connected to the junction of said first and second resistances, an amplifier including a transistor having first, second and third electrodes, said output terminal being connected through a third resistance to a first of said electrodes, a source of voltage connected to said first electrode, a source of voltage connected to said second elecrode, an output circuit for said amplifier, said third electrode being connected to said output circuit, and the first resistance combined in parallel with the series combination of said third resistance and the input resistance of said amplifier, including the resistance between said first and second electrodes, being substantially equal to the resistance of said second resistance.

9. An output circuit as in claim 8 wherein a diode is connected between the second electrode of said transistor and a reference voltage, and said output circuit includes a current transformer coupled to said third electrode.

References Cited

UNITED STATES PATENTS 3,116,425 12/1963 Kaenel ............ 307—88.5

ARTHUR GAUSS, *Primary Examiner.*

J. A. JORDAN, *Assistant Examiner.*

UNITED STATES PATENT OFFICE

CERTIFICATE OF CORRECTION

Patent No. 3,372,289 March 5, 1968

Donald G. Meyer

It is certified that error appears in the above identified patent and that said Letters Patent are hereby corrected as shown below:

Column 5, line 41, after "mon" insert -- base --. Column 6, line 13, after "said" insert -- second --.

Signed and sealed this 28th day of October 1969.

(SEAL)
Attest:

Edward M. Fletcher, Jr.
Attesting Officer

WILLIAM E. SCHUYLER, JR.
Commissioner of Patents